(12) United States Patent
Kobayashi et al.

(10) Patent No.: US 9,735,099 B2
(45) Date of Patent: Aug. 15, 2017

(54) WIRING SUBSTRATE, SEMICONDUCTOR DEVICE AND METHOD FOR MANUFACTURING SEMICONDUCTOR DEVICE

(71) Applicant: TOPPAN PRINTING CO., LTD., Tokyo (JP)

(72) Inventors: Akane Kobayashi, Tokyo (JP); Yoshito Akutagawa, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 15/384,966

(22) Filed: Dec. 20, 2016

(65) Prior Publication Data

US 2017/0103945 A1   Apr. 13, 2017

Related U.S. Application Data

(63) Continuation of application No. PCT/JP2015/067892, filed on Jun. 22, 2015.

(30) Foreign Application Priority Data

Jun. 26, 2014 (JP) ................................. 2014-131624

(51) Int. Cl.
*H01L 23/48* (2006.01)
*H01L 23/498* (2006.01)
(Continued)

(52) U.S. Cl.
CPC ...... *H01L 23/49838* (2013.01); *C09J 7/0264* (2013.01); *H01L 21/565* (2013.01); *H01L 21/78* (2013.01); *H01L 23/3114* (2013.01); *H01L 23/49894* (2013.01); *H01L 24/16* (2013.01); *H01L 24/81* (2013.01); *C09J 2203/326* (2013.01); *H01L 2221/68386* (2013.01);
(Continued)

(58) Field of Classification Search
CPC ............. H01L 23/49838; H01L 21/565; H01L 2221/68386; H01L 2224/13111
See application file for complete search history.

(56) References Cited

FOREIGN PATENT DOCUMENTS

| JP | H11-111896 A | 4/1999 |
|---|---|---|
| JP | 2010-010644 A | 1/2010 |

(Continued)

OTHER PUBLICATIONS

International Search Report issued in International Patent Application No. PCT/JP2015/067892 mailed Sep. 1, 2015.

*Primary Examiner* — Elias M Ullah
(74) *Attorney, Agent, or Firm* — Foley & Lardner LLP

(57) ABSTRACT

A wiring substrate used for improvement in manufacturing efficiency of a semiconductor device includes a support body having transparency; an adhesive layer disposed on a main surface of the support body, the adhesive layer including a peeling layer which contains a third resin which is decomposed by light irradiation and a protective layer which is disposed on the peeling layer and contains a fourth resin; and a laminate disposed on the adhesive layer, the laminate including a first resin layer, a second resin layer disposed on the first resin layer, and a wiring pattern disposed at least between the first resin layer and the second resin layer. Accordingly, the semiconductor chip and the wiring substrate which is the external connection member can be separately manufactured, thereby improving manufacturing efficiency of the semiconductor device.

14 Claims, 10 Drawing Sheets

(51) Int. Cl.
   *C09J 7/02*      (2006.01)
   *H01L 23/00*     (2006.01)
   *H01L 21/56*     (2006.01)
   *H01L 21/78*     (2006.01)
   *H01L 23/31*     (2006.01)

(52) U.S. Cl.
   CPC ........... *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/16104* (2013.01); *H01L 2224/16501* (2013.01); *H01L 2224/81005* (2013.01)

(56) References Cited

FOREIGN PATENT DOCUMENTS

| | | |
|---|---|---|
| JP | 2011-187473 A | 9/2011 |
| JP | 2012-069734 A | 4/2012 |
| JP | 2012-069919 A | 4/2012 |
| JP | 2014-007315 A | 1/2014 |

WIRING SUBSTRATE, SEMICONDUCTOR DEVICE AND METHOD FOR MANUFACTURING SEMICONDUCTOR DEVICE

CROSS-REFERENCE TO RELATED PATENT APPLICATIONS

This application is a continuation application filed under 35 U.S.C. §111(a) claiming the benefit under 35 U.S.C. §§120 and 365(c) of International Application No. PCT/JP2015/067892 filed on Jun. 22, 2015, which is based upon and claims the benefit of priority of Japanese Patent Application No. 2014-131624, filed on Jun. 26, 2014, the entireties of which are hereby incorporated by reference.

TECHNICAL FIELD

The present invention relates to wiring substrates, semiconductor devices and methods for manufacturing semiconductor devices.

BACKGROUND

In recent years, semiconductor devices using a semiconductor chip and an external connection member have been used in various industries such as electronics and automobiles. PTL 1 describes a method for manufacturing a semiconductor device in which an external connection member having a re-distribution layer and an external connection terminal is directly formed on the semiconductor chip. In this manufacturing method, the external connection member having the re-distributing layer and the external connection terminal is formed inside a semiconductor chip area. The semiconductor device provided by this manufacturing method is called a fan-in type wafer level package (WLP).

Further, PTL 2 describes a method for manufacturing a semiconductor device in which an insulation layer is formed to cover the surroundings of the semiconductor chip fixed to the support substrate, and an external connection member having a re-distributing layer and an external connection terminal is formed on the semiconductor chip and the insulation layer. In this manufacturing method, the external connection member having the re-distributing layer and the external connection terminal is formed in a peripheral area which is outside the outer edge of the semiconductor chip. The semiconductor device provided by this manufacturing method is called a fan-out type WLP.

CITATION LIST

Patent Literature

[PTL 1] JP-A-H11-111896
[PTL 2] JP-A-2011-187473
[PTL 3] JP-A-2014-7315

SUMMARY OF THE INVENTION

Technical Problem

According to the manufacturing method described in PTL 1, the number and positions of the external connection terminals are limited since the external connection member is formed inside the semiconductor chip area. Further, according to the manufacturing methods described in PTL 1 and 2, manufacturing efficiency of the semiconductor devices is lowered because the external connection members are directly formed on the singulated semiconductor chips.

The present invention has an object of providing a wiring substrate used for improvement in manufacturing efficiency of a semiconductor device, a semiconductor device with improved manufacturing efficiency, and a method for manufacturing such a semiconductor device.

Solution to Problem

According to one aspect of the present invention, a wiring substrate includes a support body having transparency; an adhesive layer disposed on a main surface of the support body; a laminate disposed on the adhesive layer, the laminate including a first resin layer, a second resin layer disposed on the first resin layer, and a wiring pattern disposed at least between the first resin layer and the second resin layer, wherein the adhesive layer includes a peeling layer which is disposed on the main surface of the support body and contains a third resin which is decomposed by light irradiation, and a protective layer which is disposed on the peeling layer so as to protect the laminate from the light and contains a fourth resin.

In the above wiring substrate, a laminate is provided as an external connection member that allows the semiconductor chip in the semiconductor device to be connected to an external device. Accordingly, the semiconductor chip and the wiring substrate which includes the external connection member can be separately manufactured, thereby improving manufacturing efficiency of the semiconductor device. Further, in the above wiring substrate, the support body has transparency. Accordingly, light is irradiated onto the peeling layer via the support body so that the third resin is decomposed to reduce an adhering force of the peeling layer. In addition, the protective layer is disposed between the peeling layer and the laminate, which prevents light energy from being transferred to the laminate. Accordingly, the resin contained in the first resin layer and the second resin layer in the laminate is prevented from being decomposed. Therefore, since the support body can be easily removed from the laminate after the semiconductor chip and the laminate of the wiring substrate are connected to each other, the semiconductor device manufactured by using the wiring substrate can be lowered in profile.

Further, the support body may have a linear expansion coefficient in a range of 1 ppm/° C. or more and 10 ppm/° C. or less. In this case, since the semiconductor chip is formed by a substrate mainly composed of an inorganic substance such as a silicon substrate, the linear expansion coefficient of the semiconductor chip and the linear expansion coefficient of the support body are close. Accordingly, displacement occurring when the semiconductor chip is mounted on the wiring substrate can be reduced.

Further, the support body may be a glass substrate. In this case, the support body can be reduced in cost and enhanced in strength, and in addition to that, the support body can be easily increased in size. Further, a surface roughness of the support body can be easily adjusted.

The main surface of the support body may have a maximum roughness in a range of 0.01 μm or more and 5 μm or less. In this case, unevenness of the laminate provided on the support body is reduced, thereby preventing disconnection or short circuit of the wiring pattern.

The protective layer may be a layer made of the fourth resin or a layer mainly composed of the fourth resin. In this case, the protective layer can be selectively removed with respect to the wiring pattern. Accordingly, etching of the wiring pattern can be prevented, thereby establishing good connection between the wiring pattern and the external device. This improves the yield of the semiconductor device manufactured by using the wiring substrate.

Further, the laminate may have a thickness in a range of 0.001 mm or more and 1 mm or less. In this case, the wiring pattern in the laminate can be protected by the first resin layer and the second resin layer, and warpage of the wiring substrate can be reduced.

According to another aspect of the present invention, a semiconductor device manufactured by using the wiring substrate described in any of the above paragraphs includes the laminate with the support body being removed, and the semiconductor chip which has the bump electrode provided on one surface and is connected to the wiring pattern of the laminate via the bump electrode. Since the semiconductor chip and the laminate which is the external connection member are separately formed, manufacturing efficiency of the semiconductor device is improved. Further, since the support body in the wiring substrate is removed from the laminate, the semiconductor device can be lowered in profile.

Further, the wiring pattern and the semiconductor chip can be connected to each other via the connection terminal including solder. In this case, if displacement occurs between the wiring pattern and the semiconductor chip, the displacement can be corrected by the connection terminal including the solder, thereby preventing connection failure which may occur between the semiconductor chip and the laminate.

Further, the wiring pattern and the semiconductor chip can be connected to each other via a connection terminal including gold. In this case, the connection terminal has improved conductivity and becomes less corrosive.

According to another aspect of the present invention, a method for manufacturing a semiconductor device includes the steps of: providing the wiring substrate described in any of the above paragraphs; mounting the semiconductor chip on the laminate of the wiring substrate and bonding the semiconductor chip to the wiring pattern; and peeling the support body from the laminate by irradiating light onto the adhesive layer via the support body.

According to the method for manufacturing a semiconductor device, light is irradiated onto the peeling layer via the support body so that the resin is decomposed to reduce an adhering force of the peeling layer. Therefore, since the support body can be easily removed from the laminate after the semiconductor chip and the laminate of the wiring substrate are connected to each other, the semiconductor device manufactured by using the wiring substrate can be lowered in profile. Further, since the semiconductor chip is mounted on the laminate by using the wiring substrate having the support body, handling of the wiring substrate can be facilitated.

Further, the light may be a laser beam. In this case, the heat energy necessary for decomposition of the resin in the peeling layer can be sufficiently applied, thereby effectively reducing the adhering force of the peeling layer.

Further, the method for manufacturing the semiconductor device may further includes the step of covering the semiconductor chip bonded to the wiring pattern with a sealing resin. In this case, the semiconductor chip can be protected by the sealing resin, and the semiconductor chip can be prevented from being detached from the laminate.

Further, the method for manufacturing the semiconductor device may further includes the step of removing the adhesive layer from the laminate after the step of peeling the support body from the laminate.

Further, the method for manufacturing the semiconductor device may further includes the steps of: providing an external connection terminal on the laminate after the step of peeling the support body from the laminate; and cutting the laminate for singulation.

Advantageous Effects of Invention

According to the wiring substrate, the semiconductor device, and a method for manufacturing the semiconductor device of the present invention, a wiring substrate used for improvement in manufacturing efficiency of the semiconductor device and reduction in profile of the semiconductor device, a semiconductor device with lower profile and improved manufacturing efficiency, and a method for manufacturing such a semiconductor device can be provided.

DESCRIPTION OF REPRESENTATIVE EMBODIMENTS

With reference to the accompanying drawings, preferred embodiments of the present invention will be described in detail. In the following description, the same elements or elements having the same functions are denoted by the same reference signs, and duplicated description thereof is omitted. It is noted that the present invention is not necessarily limited to the following discussion and accompanying Figures.

Figure 1:
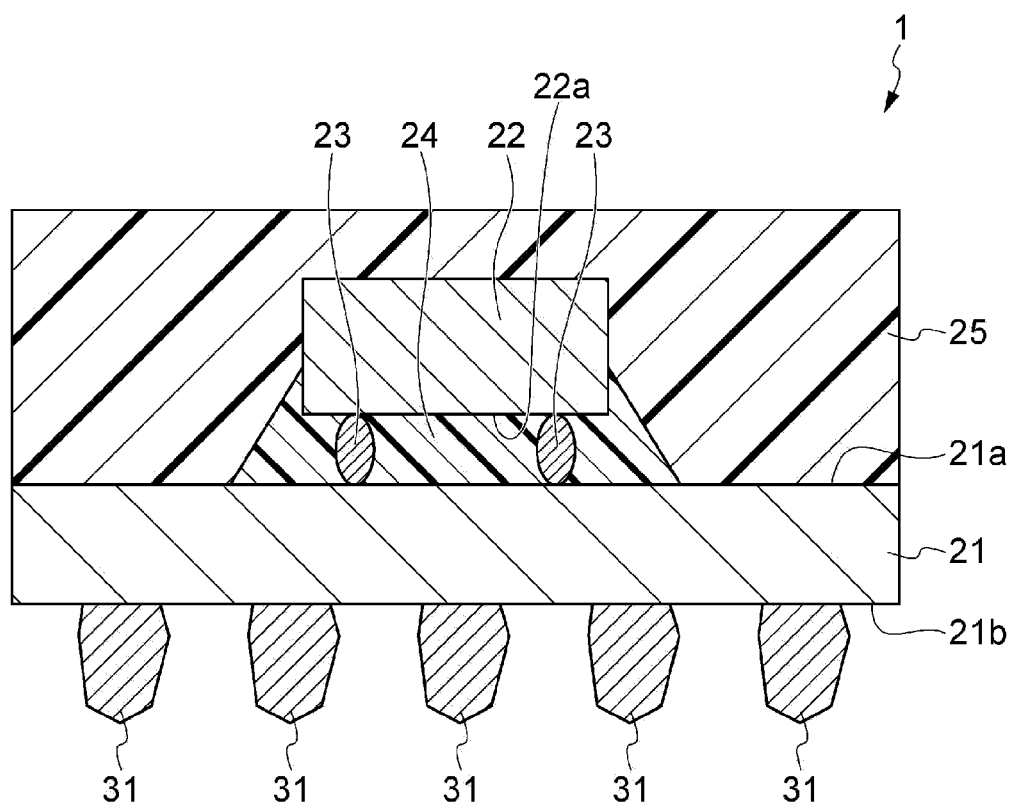
FIG. 1 is a view which illustrates a semiconductor device manufactured by using a wiring substrate of the present embodiment.

FIG. 1 is a view which illustrates a semiconductor device manufactured by using a wiring substrate of the present embodiment. As shown in FIG. 1, a semiconductor device 1 includes a laminate 21, a semiconductor chip 22, an underfill 24, a mold resin 25, and a plurality of external connection terminals 31. Further, details of the laminate 21 will be described below.

The semiconductor chip 22 is, for example, an integrated circuit (IC or LSI) which includes transistors, diodes or the like formed on the surface of a semiconductor substrate, and has a substantially cuboid shape. The semiconductor substrate used for the semiconductor chip 22 may be a substrate mainly composed of an inorganic substance such as a silicon substrate (Si substrate), gallium nitride substrate (GaN substrate) or silicon carbide substrate (SiC substrate). In the present embodiment, a silicon substrate is used for the semiconductor substrate. The semiconductor chip 22 manufactured by using the silicon substrate has a linear expansion coefficient (CTE: coefficient of thermal expansion) approximately in a range of 2 to 4 ppm/° C. (for example, 3 ppm/° C.). The linear expansion coefficient in the present embodiment is a ratio of change in length to the original length due to increase in temperature, for example, in a temperature range between 20° C. and 260° C.

On a surface 22a of the semiconductor chip 22, bump electrodes (also referred to as bumps) 23 are provided. The semiconductor chip 22 is electrically connected to a wiring pattern (not shown in the figure) exposed on the main surface 21a on one side of the laminate 21 via the bump electrodes 23. The bump electrodes 23 are made of a metal such as Au, Ag, Cu, Al, or an alloy thereof, a metal composite of Cu plated with Au or the like, or a solder of Sn, Sn—Pb, Sn—Ag, Sn—Cu, Sn—Ag—Cu, Sn—Bi or an Au-based solder. The bump electrodes 23 may be disposed over the entire area of the semiconductor chip 22 or may be disposed on the peripheral area of the semiconductor chip 22. A wiring substrate 11 (not shown in the figure) and the semiconductor chip 22 may be connected to each other by a method such as wire bonding method or flip chip bonding. In this embodiment, the semiconductor chip 22 and the laminate 21 are connected to each other by a flip chip method in view of reduction in mounting area and improvement in production efficiency.

The underfill 24 is an adhesive used to fix and seal the semiconductor chip 22 to the laminate 21. The underfill 24 is made of a material, for example, one of an epoxy resin, polyurethane resin, silicone resin, polyester resin, oxetane resin, maleimide resin or a mixture of two or more thereof with a filler such as silica, titanium oxide, aluminum oxide, magnesium oxide, zinc oxide or the like added thereto. The underfill 24 may be in the form of liquid or film.

The mold resin 25 is a sealing resin used to cover the semiconductor chip 22 for sealing and protection. The mold resin 25 is made of a material, for example, one of an epoxy resin, polyurethane resin, silicone resin, polyester resin, oxetane resin, maleimide resin or a mixture of two or more thereof with a filler such as silica, titanium oxide, aluminum oxide, magnesium oxide, zinc oxide or the like added thereto.

The external connection terminals 31 are disposed on a main surface 21b on the other side of the laminate 21. The external connection terminals 31 are electrically connected to the semiconductor chip 22 via a wiring pattern provided in the laminate 21. The external connection terminal 31 is formed of, for example, a solder of Sn, Sn—Pb, Sn—Ag, Sn—Cu, Sn—Ag—Cu, Sn—Bi or the like. When the external connection terminal 31 is formed of a solder, a portion of the main surface 21b on the other side of the laminate 21 to which the wiring pattern is exposed may undergo plating such as Ni plating, Au plating or Sn plating, a pre-solder treatment, or an organic coating treatment such as organic solderability preservative (OSP) before the external connection terminals 31 are formed.

Figure 2:
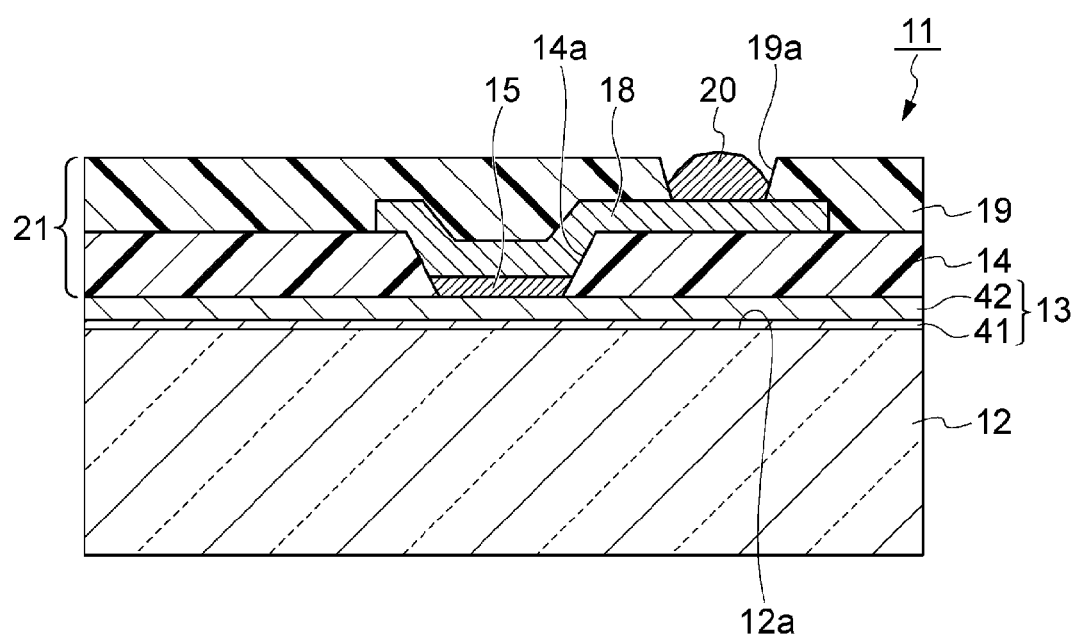
FIG. 2 is a view which illustrates the wiring substrate of the present embodiment.

FIG. 2 is a view which illustrates the wiring substrate of the present embodiment. As shown in FIG. 2, the wiring substrate 11 includes a support body 12, an adhesive layer 13 and the laminate 21. The laminate 21 includes a first resin layer 14, a connection pad 15, a wiring pattern 18, a second resin layer 19 and a connection terminal 20. The laminate 21 has a thickness, which may be, for example, in a range of 0.001 mm or more and 1 mm or less, 0.01 mm or more and 0.8 mm or less, 0.03 mm or more and 0.5 mm or less, 0.001 mm or more and 0.8 mm or less, 0.001 mm or more and 0.5 mm or less, 0.01 mm or more and 0.8 mm or less, or 0.01 mm or more and 0.5 mm or less. When the laminate 21 has a thickness of 0.001 mm or more, the wiring pattern 18 disposed in the laminate 21 can be protected by the first resin layer 14 and the second resin layer 19. When the laminate 21 has a thickness of 1 mm or less, warpage of the wiring substrate 11 due to the difference in the linear expansion coefficient or the like between the support body 12 and the laminate 21 can be prevented. Further, the thickness of the laminate 21 herein refers to that from the upper surface of the adhesive layer 13 to the top of the second resin layer 19 or the wiring pattern 18 in the thickness direction. That is, the "thickness" is a length in a direction perpendicular to the main surface of the wiring substrate 11.

The support body 12 is a substrate made of a material, for example, having light transmissive properties (transparency). The support body 12 has a main surface 12a which is formed in, for example, a substantially rectangular shape, a substantially circular shape, a substantially oval shape or the like. The support body 12 transmits light with a wavelength, for example, in a range of 300 nm or more and 2000 nm or less, or in a range of 300 nm or more and 1100 nm or less. The support body 12 may have properties that transmit light with a specific wavelength, for example, a laser beam. The support body 12 is formed of, for example, a glass substrate. Examples of the glass include a quartz glass, borosilicate glass, non-alkali glass, soda glass, sapphire glass and the like. Preferably, the glass has a linear expansion coefficient close to the linear expansion coefficient of the aforementioned semiconductor chip 22, for example, in a range of −1 ppm/° C. or more and 10.0 ppm/° C. or less (or in a range of 0.5 ppm/° C. or more and 5.0 ppm/° C. or less). A maximum roughness Rz of the main surface 12a of the support body 12 in compliance with JIS B 0601:2013 may be, for example, in a range of 0.01 µm or more and 5 µm or less, or in a range of 0.1 µm or more and 3 µm or less. When the maximum roughness Rz of the main surface 12a of the support body 12 is 0.01 µm or more, increase in the cost for providing the support body 12 is prevented. When the maximum roughness Rz of the main surface 12a of the support body 12 is 5 µm or less, disconnection or short circuit of the wiring pattern 18 due to unevenness of the main surface 12a is reduced.

The adhesive layer 13 serves to adhere the support body 12 and the laminate 21 to each other. The adhesive layer 13 includes a peeling layer 41 disposed on the main surface 12a of the support body 12, and a protective layer 42 disposed on the peeling layer 41.

The peeling layer 41 includes a resin which is decomposed by light irradiation (third resin). Since the light in the present embodiment is a laser beam, the resin included in the peeling layer 41 is thermally decomposed by irradiation of a laser beam. Examples of the resin included in the peeling layer 41 include one of an epoxy resin, polyurethane resin, silicone resin, polyester resin, oxetane resin, maleimide resin or a mixture of two or more thereof. The peeling layer 41 has a thickness, for example, in a range between 1 µm and 10 µm.

The protective layer 42 is configured to protect the laminate 21 from the light irradiated from outside via the support body 12. The protective layer 42 is made of a material, for example, one of an epoxy resin, polyurethane resin, silicone resin, polyester resin, oxetane resin, maleimide resin or a mixture of two or more thereof (fourth resin).

The protective layer 42 may be a layer made of the above resin or a layer mainly composed of the above resin. The protective layer 42 has a thickness sufficiently larger than the thickness of the peeling layer 41, for example, in a range between 20 μm and 100 μm, in view of protection of the laminate 21 from light.

The first resin layer 14 is a resin layer disposed on the adhesive layer 13 and has an opening 14a. The first resin layer 14 includes a resin material such as an epoxy resin, polyimide, maleimide resin, polyethylene terephthalate, polyphenylene oxide, liquid crystal polymer, silicone or the like, or a composite material thereof. Further, the first resin layer 14 may include an inorganic filler or an organic filler. For example, the first resin layer 14 may include a material of a combination of an epoxy resin and a glass fiber. A solder resist made of, for example, an epoxy-based insulation resin or the like may be used for the first resin layer 14. The first resin layer 14 has a thickness, for example, in a range between 0.5 μm and 30 μm.

The connection pad 15 is a conductive layer made of a metal such as Au, and is disposed in the opening 14a of the first resin layer 14. The connection pad 15 may be in contact with the adhesive layer 13 in the opening 14a. The connection pad 15 has a thickness, for example, in a range between 0.001 μm and 3 μm.

The wiring pattern 18 is a conductive layer made of a metal such as Au, Cu or Ni and is disposed on the first resin layer 14 and the connection pad 15. The wiring pattern 18 is electrically connected to the connection pad 15 via the opening 14a of the first resin layer 14. The wiring pattern 18 has a thickness, for example, in a range between 1 μm and 20 μm.

The second resin layer 19 is a resin layer disposed on the first resin layer 14, the connection pad 15 and the wiring pattern 18 and has an opening 19a. The second resin layer 19 includes a resin material such as an epoxy resin, polyimide, maleimide resin, polyethylene terephthalate, polyphenylene oxide, liquid crystal polymer, silicone or the like, or a composite material thereof. Further, the second resin layer 19 may include an inorganic filler or an organic filler. For example, the second resin layer 19 may include a material of a combination of an epoxy resin and a glass fiber. A solder resist made of, for example, an epoxy-based insulation resin or the like may be used for the second resin layer 19. The opening 19a disposed in the second resin layer 19 does not overlap the opening 14a of the first resin layer 14, and allows the wiring pattern 18 to be partially exposed. The second resin layer 19 has a thickness, for example, in a range between 0.5 μm and 30 μm.

The connection terminal 20 is disposed in the opening 19a of the second resin layer 19 so as to facilitate electrical connection of the wiring pattern 18 to the bump electrode 23 of the semiconductor chip 22. The connection terminal 20 is formed of, for example, a eutectic solder or lead free solder (Sn—Ag, Sn—Cu, Sn—Ag—Cu, Sn—Bi or the like). The connection terminal 20 may also be a terminal formed of a conductive layer made of a various metals on which a eutectic solder or lead free solder is provided. Alternatively, the connection terminal 20 may be formed by plating the opening 19a with Ni, Au, Sn or the like or applying an organic coating treatment such as OSP on the opening 19a. Further, the connection terminal 20 may also be formed by plating the wiring pattern 18 with gold. In this case, the connection terminal 20 has improved conductivity and becomes less corrosive. When the bump electrode 23 of the semiconductor chip 22 is a gold ball bump (for example, a gold bump made of Au, an alloy containing Au or a metal composite having a surface plated with Au, or a bump formed of an Au-based solder), connection between the bump electrode 23 and the connection terminal plated with gold is improved.

Next, with reference to FIGS. 3A to 3C and FIGS. 4A to 4C a method for manufacturing the wiring substrate according to the present embodiment will be described. FIGS. 3A to 3C and FIGS. 4A to 4C are views which illustrate an example of the method for manufacturing the wiring substrate.

Figure 3A:
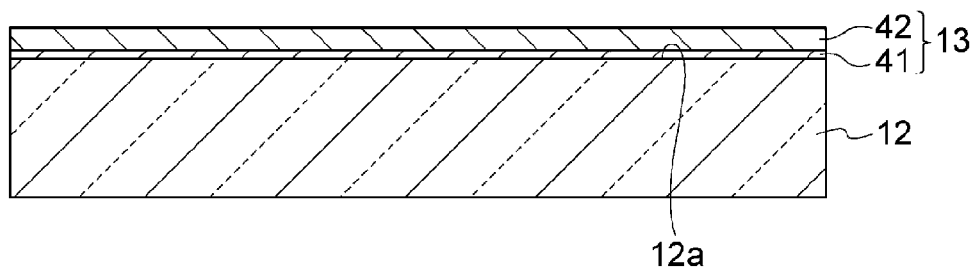
FIGS. 3A to 3C are views which illustrate an example of a method for manufacturing the wiring substrate.
Figure 3B:
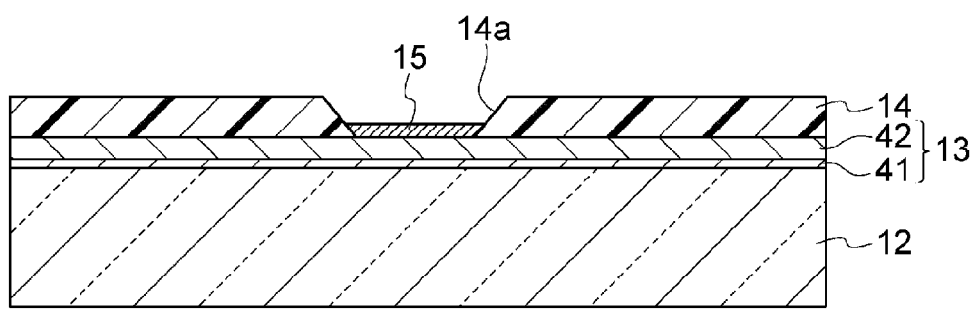

First, as shown in FIG. 3A, the adhesive layer 13 which includes the peeling layer 41 and the protective layer 42 is formed on the main surface 12a of the support body 12. The peeling layer 41 is formed by a known method such as printing, vacuum pressing, vacuum laminating, roll laminating, spin coating, die coating, curtain coating, roller coating, photolithography or the like. Further, the protective layer 42 is formed by a method such as printing, vacuum pressing, vacuum laminating, roll laminating, spin coating, die coating, curtain coating, roller coating, photolithography or the like, or a combination thereof Then, as shown in FIG. 3B, the first resin layer 14 is provided on the adhesive layer 13, and then the opening 14a is formed in the first resin layer 14. The connection pad 15 is formed in the opening 14a. The first resin layer 14 is formed by a known method such as printing, vacuum pressing, vacuum laminating, roll laminating, spin coating, die coating, curtain coating, roller coating, photolithography or the like. The opening 14a is formed by removing a portion of the first resin layer 14 by performing, for example, laser irradiation or photolithography of the first resin layer 14. The connection pad 15 is provided, for example, by plating. The connection pad 15 may not be necessarily provided.

Figure 3C:
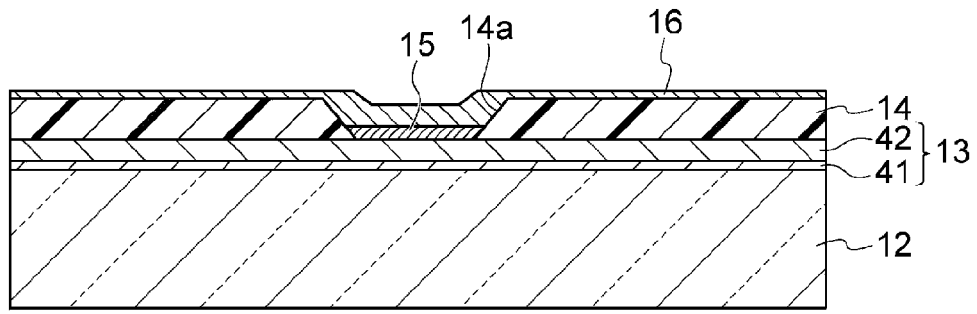

Then, as shown in FIG. 3C, a seed layer 16 is provided on the first resin layer 14 and the connection pad 15. The seed layer 16 is connected to the connection pad 15 via the opening 14a of the first resin layer 14. The seed layer 16 is formed by a method such as electroless plating, sputtering, CVD or the like. Alternatively, the seed layer 16 may be formed by bonding a conductive foil made of Cu or the like on the first resin layer 14. The seed layer 16 is formed of, for example, a Cu layer, Cu layer plated with Ni, Cu layer plated with Au, Cu layer plated with solder, Al layer or Ag/Pd alloy layer. In the present embodiment, a Cu layer is used in view of the cost, electrical properties and ease of manufacturing.

Figure 4A:
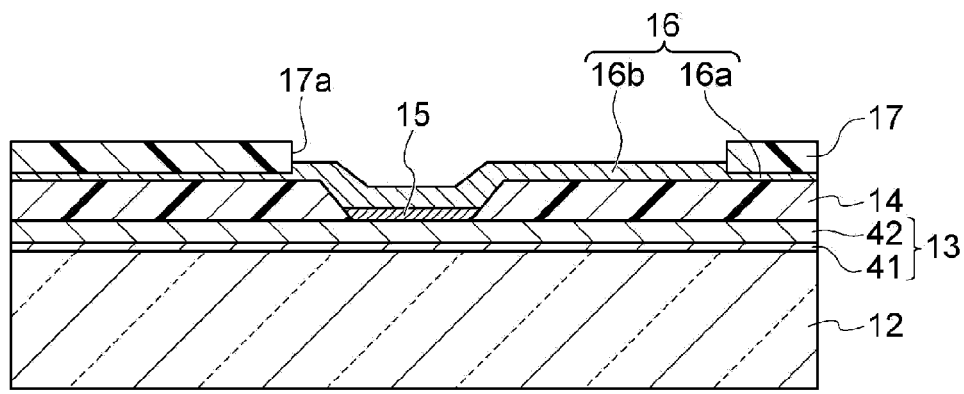
FIGS. 4A to 4C are views which illustrate an example of the method for manufacturing the wiring substrate.

Next, as shown in FIG. 4A, a resist 17 having an opening 17a is formed on the seed layer 16. Then, a portion of the seed layer 16 exposed via the opening 17a is thickened, for example, by plating. A thin portion of the seed layer 16 is referred to as a first region 16a, and a thick portion is referred to as a second region 16b. The first region 16a is disposed between the first resin layer 14 and the resist 17. The second region 16b is formed of, for example, a Cu layer, Cu layer plated with Ni, Cu layer plated with Au, Cu layer plated with solder, Al layer or Ag/Pd alloy layer. In the present embodiment, a Cu layer is used in view of the cost, electric properties and ease of manufacturing. Further, a photoresist of a negative type or a positive type may also be used for the resist 17.

Figure 4B:
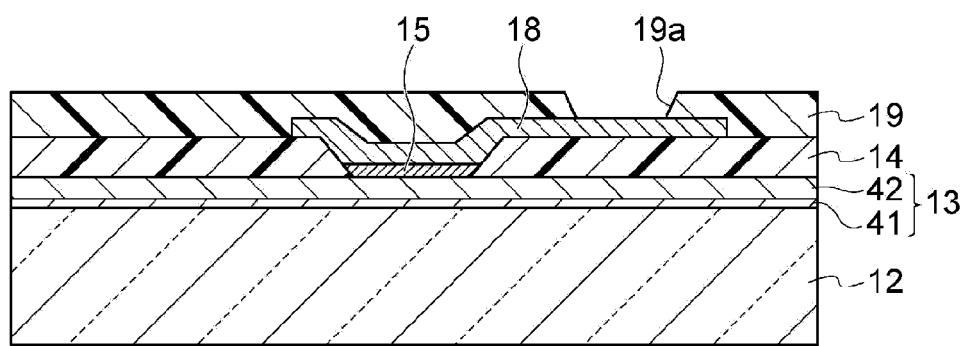

Then, as shown in FIG. 4B, the wiring pattern 18 is formed by removing the resist 17 and the first region 16a of the seed layer 16. The resist 17 may be removed from the first resin layer 14, for example, by lift-off or etching. The first region 16a is removed, for example, by wet etching or dry etching. When the first region 16a is removed, the second region 16b becomes the wiring pattern 18. A portion of the second region 16b may be etched at the same time with etching of the first region 16a. That is, the wiring pattern 18 of the present embodiment is formed by a semi-additive method. The semi-additive method is a method for forming a wiring pattern by providing a seed layer such as a Cu layer, forming a resist of a desired pattern on the seed layer, thickening an exposed portion of the seed layer by electroplating or the like, removing the resist, and then etching the thin seed layer.

Further, as shown in FIG. 4B, the second resin layer 19 is formed on the first resin layer 14 and the wiring pattern 18 after the wiring pattern 18 is formed, and the opening 19a is formed in a portion of the second resin layer 19. The second resin layer 19 is formed by a known method such as printing, vacuum pressing, vacuum laminating, roll laminating, spin coating, die coating, curtain coating, roller coating, photolithography or the like. The opening 19a is formed by removing a portion of the second resin layer 19 by performing, for example, laser irradiation or photolithography of the second resin layer 19. By forming the opening 19a, a portion of the wiring pattern 18 is exposed.

Figure 4C:
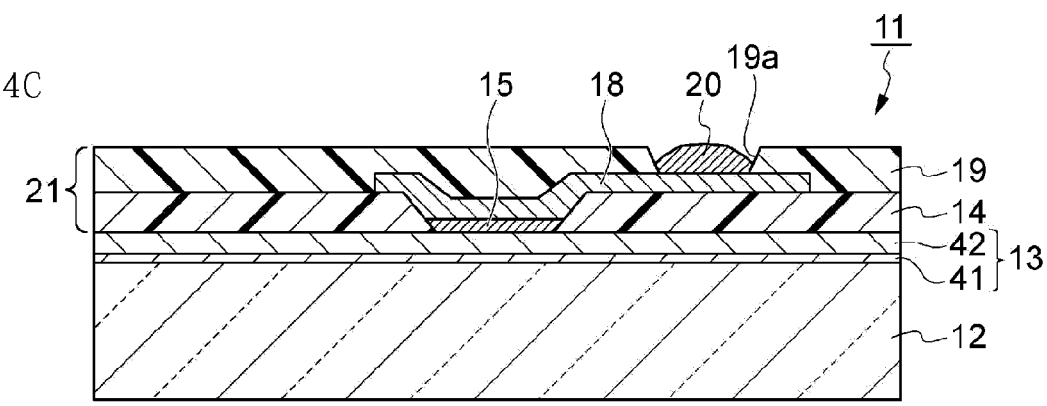

Finally, as shown in FIG. 4C, the connection terminal 20 is formed in the opening 19a. The connection terminal 20 is formed of, for example, by providing a eutectic solder or lead free solder in the opening 19a. As described above, the wiring substrate 11 which includes the support body 12, the adhesive layer 13, and the laminate 21 including the first resin layer 14, the connection pad 15, the wiring pattern 18, the second resin layer 19 and the connection terminal 20 can be formed.

Next, with reference to FIGS. 5A to 5C, FIGS. 6A to 6C and FIGS. 7A to 7C, a method for manufacturing a semiconductor device using the wiring substrate according to the present embodiment will be described. FIGS. 5A to 5C, FIGS. 6A to 6C and FIGS. 7A to 7C are views which illustrate an example of a method for manufacturing the semiconductor device.

Figure 5A:
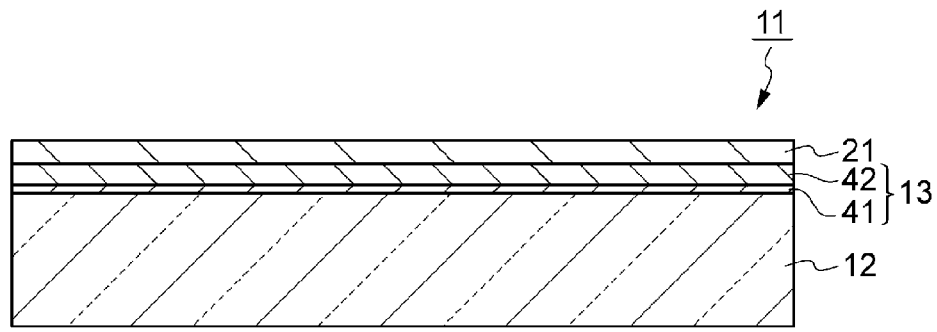
FIGS. 5A to 5C are views which illustrate an example of a method for manufacturing the semiconductor device.

First, as shown in FIG. 5A, the wiring substrate 11 which includes the support body 12, the adhesive layer 13 and the laminate 21 is provided. The wiring substrate 11 is the same as the wiring substrate 11 shown in FIG. 2 or FIG. 4C.

Figure 5B:
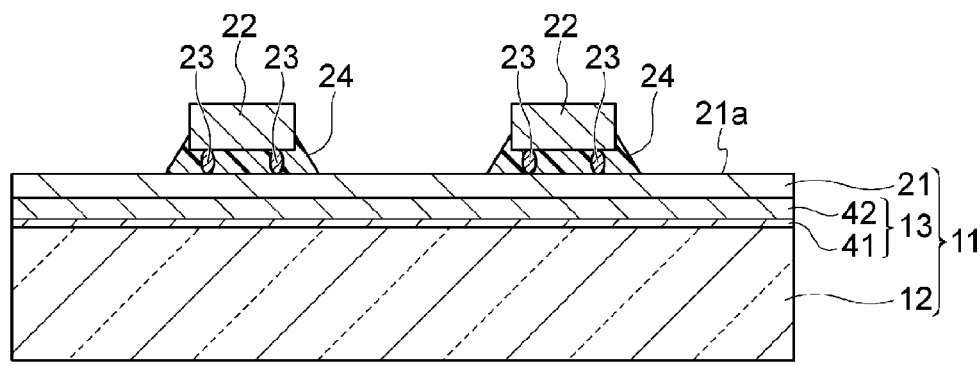

Then, as shown in FIG. 5B, a plurality of semiconductor chips 22 are mounted on the wiring substrate 11. Specifically, the semiconductor chip 22 is mounted on the main surface 21a on one side of the laminate 21 in the wiring substrate 11 by a flip chip method. When the semiconductor chip 22 is mounted on the wiring substrate 11, the bump electrode 23 of the semiconductor chip 22 and the connection terminal 20 of the wiring substrate 11 (see FIG. 2) are connected to each other. Further, the underfill 24 is provided between the semiconductor chip 22 and the wiring substrate 11 so as to fix and seal the semiconductor chip 22 and the wiring substrate 11. The underfill 24 may be supplied between the semiconductor chip 22 and the wiring substrate 11 after the semiconductor chip 22 is mounted on the wiring substrate 11. Alternatively, the underfill 24 may be attached to the semiconductor chip 22 or the wiring substrate 11 in advance so that sealing by the underfill 24 is completed at the same time as when the semiconductor chip 22 is mounted on the wiring substrate 11. For example, the semiconductor chip 22 and the wiring substrate 11 is fixed and sealed by the underfill 24 when the underfill 24 is cured by heating or light irradiation. The underfill 24 may not be necessarily provided.

Figure 5C:
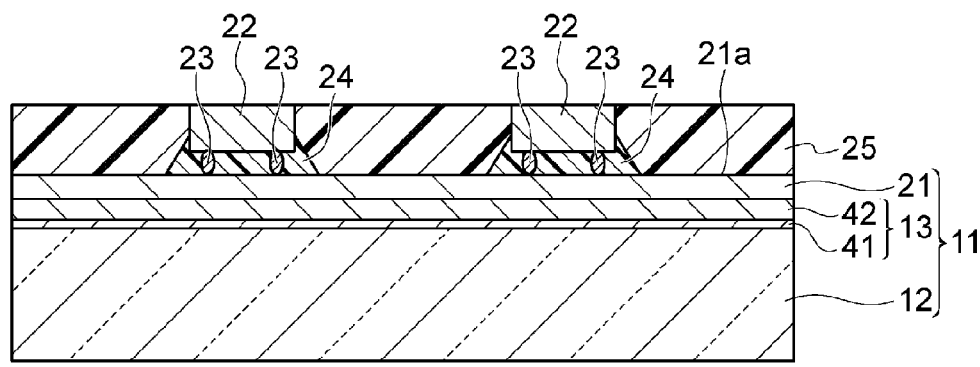

Then, as shown in FIG. 5C, the mold resin 25 is formed on the main surface 21a on one side of the laminate 21. In so doing, the semiconductor chips 22 are embedded in the mold resin 25. The mold resin 25 is formed by a known method such as transfer molding or potting. The semiconductor chip 22 may be covered so as to be sealed by the mold resin 25.

Figure 6A:
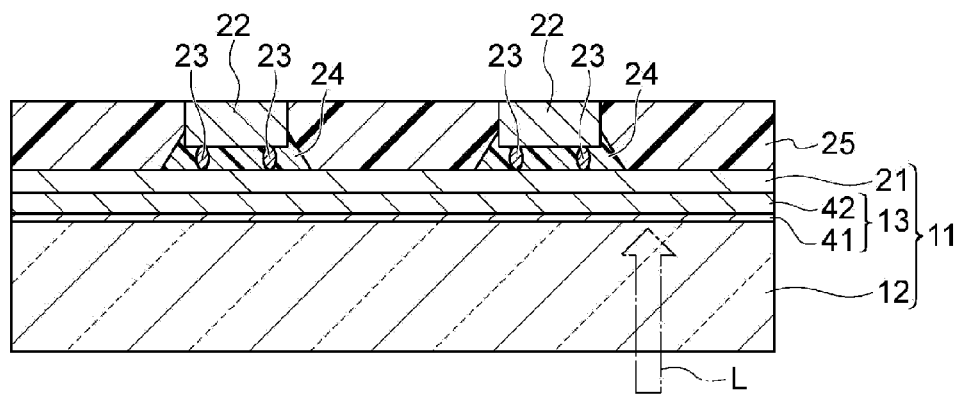
FIGS. 6A to 6C are views which illustrate an example of the method for manufacturing the semiconductor device.

Then, as shown in FIG. 6A, a laser beam L is irradiated onto the adhesive layer 13 via the support body 12. The laser beam L may be irradiated over the entire surface of the support body 12, or may be irradiated onto a desired position on the support body 12. According to the present embodiment, the laser beam L is irradiated over the entire surface in a linearly reciprocating manner in order to ensure decomposition of the resin of the peeling layer 41 in the adhesive layer 13. The laser beam L may have a wavelength, for example, in a range of 300 nm or more and 2000 nm or less, 300 nm or more and 1500 nm or less, or 300 nm or more and 1100 nm or less. An example of the device that emits the laser beam L includes a YAG laser that emits a wavelength of 1064 nm, a second harmonic YAG laser that emits a wavelength of 532 nm, and a semiconductor laser that emits a wavelength of 780 to 1300 nm. The support body 12 has transparency, and transmits the laser beam L. Accordingly, an energy of the laser beam L which is transmitted through the support body 12 is absorbed by the adhesive layer 13. The absorbed energy of the laser beam L is converted into a heat energy in the adhesive layer 13. Accordingly, by virtue of this heat energy, the resin of the peeling layer 41 reaches a thermal decomposition temperature and is thermally decomposed. This reduces the adhering force of the peeling layer 41 adhering the support body 12 and the laminate 21.

Figure 6B:
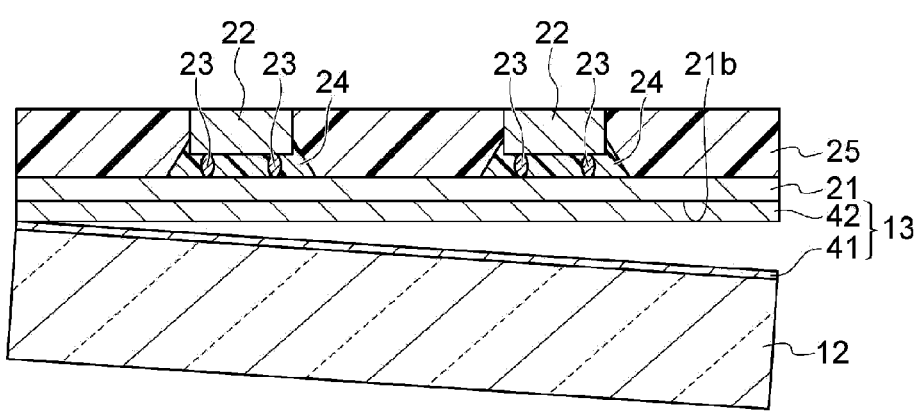
Figure 6C:
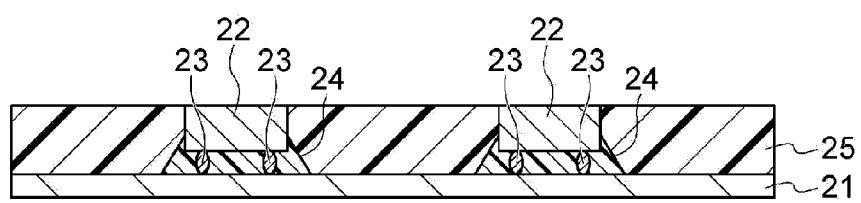

Then, as shown in FIG. 6B, the support body 12 is peeled off from the laminate 21. The support body 12 may be peeled off from the laminate 21 manually or by using a machine. Then, the adhesive layer 13 (more specifically, the protective layer 42) is removed from the laminate 21. When the peeling layer 41 is left, the adhesive layer 13 having the peeling layer 41 and the protective layer 42 is removed. For example, the adhesive layer 13 which is left on the main surface 21b on the other side of the laminate 21 can be removed from the laminate 21 by peeling off after an adhesive tape is adhered to the main surface 21b on the other side of the laminate 21. Alternatively, the main surface 21b on the other side of the laminate 21 may be immersed in a mixture solution of potassium permanganate aqueous solution and sodium hydroxide aqueous solution or the like to remove the adhesive layer 13. Further, the mixture solution can also be sprayed onto the main surface 21b on the other side of the laminate 21 to remove the adhesive layer 13. Alternatively, the main surface 21b on the other side of the laminate 21 may be immersed in an organic solvent such as acetone or methyl ethyl ketone to remove the adhesive layer 13. Further, the organic solvent can also be sprayed onto the main surface 21b on the other side of the laminate 21 to remove the adhesive layer 13. The adhesive layer 13 may be left on the main surface 21b on the other side of the laminate 21. In this case, an opening for providing the external connection terminal 31 needs to be formed by using a laser beam or the like. Accordingly, as shown in FIG. 6C, the support body 12 and the adhesive layer 13 are removed from the laminate 21.

Figure 7A:
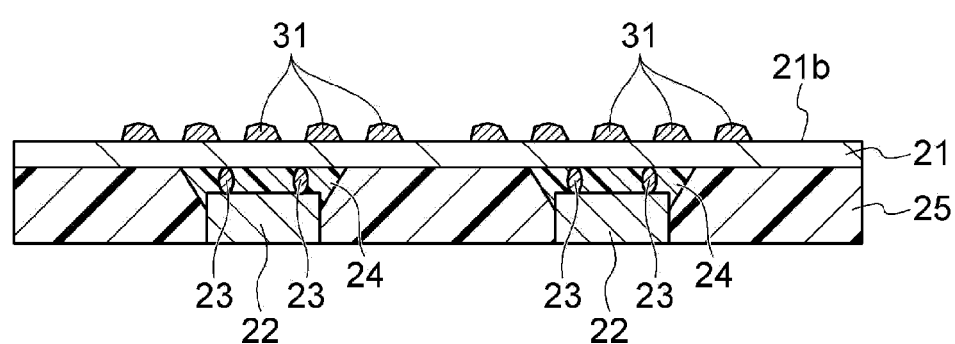
FIGS. 7A to 7C are views which illustrate an example of the method for manufacturing the semiconductor device.

Then, as shown in FIG. 7A, a plurality of external connection terminals 31 are formed on the main surface 21b on the other side of the laminate 21. Specifically, the external connection terminals 31 are formed on a portion of the laminate 21 which corresponds to the connection pad 15 (see FIG. 2). For example, the external connection terminals 31 are formed by a solder ball mounting method or the like.

Figure 7B:
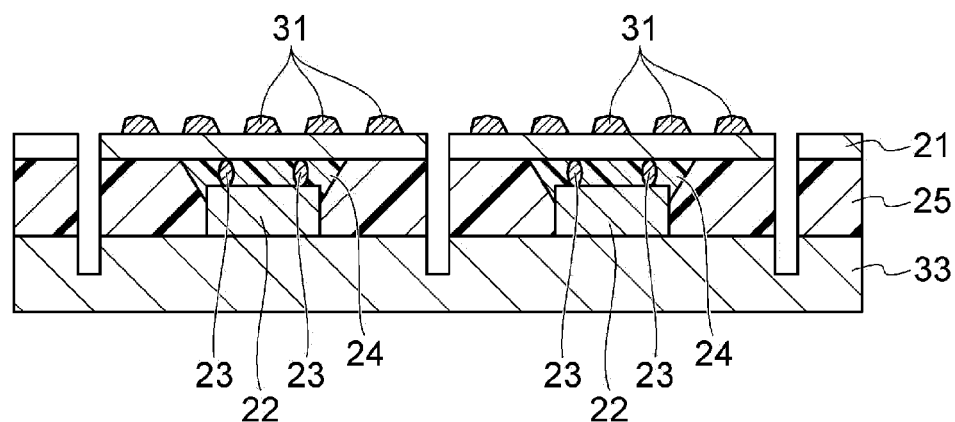
Figure 7C:
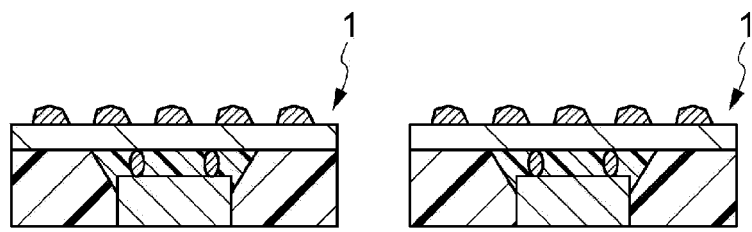

Then, as shown in FIG. 7B, a dicing tape 33 is adhered to the mold resin 25. After that, the laminate 21 and the mold resin 25 are cut at positions between the respective semiconductor chips 22 for singulation. For example, the laminate 21 and the mold resin 25 are cut by using a dicing saw, laser or the like. Accordingly, as shown in FIG. 7C, the semiconductor devices 1 fabricated by using the wiring substrate 11 are manufactured.

As described, the wiring substrate 11 according to the present embodiment includes the laminate 21 which serves as an external connection member that allows the semiconductor chip 22 in the semiconductor device 1 to be connected to an external device. Accordingly, the semiconductor chip 22 and the wiring substrate 11 which includes the external connection member can be separately manufactured, thereby improving manufacturing efficiency of the semiconductor device 1. Further, in the above wiring substrate 11, the support body 12 has transparency. Accordingly, light is irradiated onto the peeling layer 41 via the support body 12 so that the resin is decomposed to reduce an adhering force of the peeling layer 41. Therefore, the support body 12 can be easily removed from the laminate 21 after the semiconductor chip 22 and the laminate 21 of the wiring substrate 11 are connected to each other. This enables lower profiled semiconductor device 1 manufactured by using the wiring substrate 11. Moreover, the adhesive layer 13 includes the peeling layer 41 and the protective layer 42, and the protective layer 42 is disposed between the peeling layer 41 and the laminate 21. This can prevent an energy of light (for example, laser beam) from being transferred to the laminate 21. Accordingly, the resin contained in the first resin layer 14 and the second resin layer 19 in the laminate 21 is prevented from being decomposed. Furthermore, since the semiconductor device 1 is manufactured by using the wiring substrate 11 having the support body 12, handling of the wiring substrate 11 can be facilitated.

Further, the support body 12 may have a linear expansion coefficient in a range of −1 ppm/° C. or more and 10 ppm/° C. or less. In this case, since the semiconductor chip 22 is formed by a substrate mainly composed of an inorganic substance such as a silicon substrate, the linear expansion coefficient of the semiconductor chip 22 and the linear expansion coefficient of the support body 12 are close. Accordingly, displacement which occurs when the semiconductor chip 22 is mounted on the wiring substrate 11 can be reduced. This prevents failure of mounting of the semiconductor chip 22 on the wiring substrate 11 and damage at the connection between the semiconductor chip 22 and the wiring substrate 11.

Further, the support body 12 may be a glass substrate. In this case, the support body 12 can be reduced in cost and enhanced in strength, and in addition to that, the support body 12 can be easily increased in size. Further, a surface roughness of the support body 12 can be easily adjusted.

The main surface 12a of the support body 12 may have a maximum roughness Rz in a range of 0.01 µm or more and 5 µm or less. In this case, unevenness of the laminate 21 provided on the support body 12 is reduced, thereby preventing disconnection or short circuit of the wiring pattern 18.

The protective layer 42 may be a layer made of a resin or a layer mainly composed of a resin. In this case, the protective layer 42 can be selectively removed with respect to the connection pad 15. Accordingly, etching of the connection pad 15 can be prevented, thereby establishing good connection between the connection pad 15 and the external connection terminal 31. This improves the yield of the semiconductor device 1.

The laminate 21 may have a thickness in a range of 0.001 mm or more and 1 mm or less. In this case, the wiring pattern 18 in the laminate 21 can be protected by the first resin layer 14 and the second resin layer 19, and warpage of the wiring substrate 11 can be reduced.

Further, the light may be a laser beam L. In this case, the heat energy necessary for decomposition of the resin in the peeling layer 41 can be sufficiently applied, thereby effectively reducing the adhering force of the peeling layer 41. Further, since the laser beam L is irradiated onto the peeling layer 41 via the support body 12, the adhering force of the peeling layer 41 can be effectively reduced without causing damage by the laser beam L to the semiconductor chip 22.

Further, the semiconductor device 1 manufactured by using the wiring substrate 11 of the present embodiment includes the laminate 21 with the support body 12 being removed, and the semiconductor chip 22 which has the bump electrode 23 provided on the surface 22a and is connected to the wiring pattern 18 of the laminate 21 via the bump electrode 23. Since the semiconductor chip 22 and the laminate 21 which is the external connection member are separately formed, manufacturing efficiency of the semiconductor device 1 is improved. Further, since the support body 12 in the wiring substrate 11 is removed from the laminate 21, the semiconductor device 1 can be lowered in profile.

Further, the wiring pattern 18 and the semiconductor chip 22 can be connected to each other via the connection terminal 20 including solder. In this case, if displacement occurs between the wiring pattern 18 and the semiconductor chip 22, the displacement can be corrected by the solder included in the connection terminal 20, thereby preventing connection failure which may occur between the semiconductor chip 22 and the laminate 21.

Figure 8:
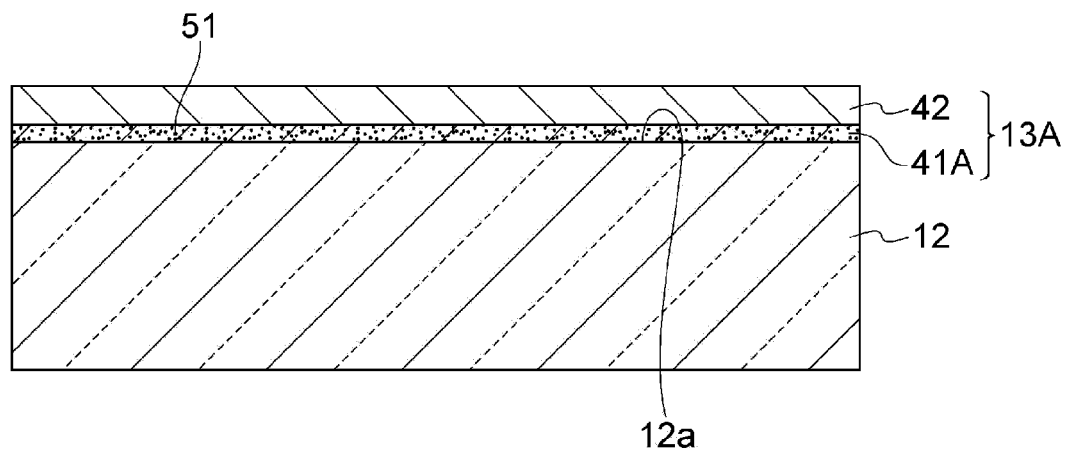
FIG. 8 is a view which shows a portion of the wiring substrate according to a modified example.

FIG. 8 is a view which shows a portion of the connection wiring according to a modified example. As shown in FIG. 8, the peeling layer 41A of the adhesive layer 13A may contain a metal such as copper, nickel, gold, silver, titanium, chromium, aluminum or the like and a metal oxide thereof. This metal and the metal oxide are, for example, particles 51 dispersed in the peeling layer 41A. The particles 51 dispersed in the peeling layer 41A are more likely to absorb the energy of light such as a laser beam compared with the resin of the peeling layer 41A. The light energy absorbed by the particle 51 is converted into the heat energy, and the heat energy is transferred into the peeling layer 41A so as to facilitate decomposition of the resin in the peeling layer 41A. This contributes to reduction of the adhering force of the peeling layer 41A by a reduced amount of the total light energy irradiated onto the wiring substrate 11 so that the transfer of the light energy to the laminate 21 can be further prevented. Accordingly, the resin contained in the first resin layer 14 and the second resin layer 19 in the laminate 21 is advantageously prevented from being decomposed. The metal or metal oxide contained in the peeling layer 41A may be fragments rather than particles.

The wiring substrate, the semiconductor device and the method for manufacturing the semiconductor device according to the present invention are not limited to the aforementioned embodiment, and various modifications can be made. For example, the above embodiment and modifications can be combined as appropriate. Further, a plurality of semiconductor chips 22 may be mounted on the laminate 21 inside the area of the wiring substrate 11 to be singulated. Further, other members than the semiconductor chip 22 (for example, passive components such as capacitor) may be mounted on the laminate 21.

For example, the opening 14a of the first resin layer 14 and the opening 19a of the second resin layer 19 may overlap each other. For example, the connection terminal 20 of the laminate 21 may not be necessarily provided.

Further, the wiring pattern 18 of the wiring substrate 11 is formed not only by a semi-additive method, but also any known method such as a subtractive method or a full additive method. The subtractive method is a method for obtaining a wiring pattern by forming a resist of a desired pattern on a conductive layer such as a Cu layer, etching the unnecessary conductive layer, and then peeling off the resist. Furthermore, the full additive method is a method for obtaining a desired wiring pattern by suctioning an electroless plating catalyst onto the resin layer to form a resist of a desired pattern on the resin layer, activating the catalyst with the resist being left as an insulative film, depositing the conductor such as Cu into the resist opening by electroless plating, and then removing the resist.

Further, a new wiring pattern and the third resin layer may be formed on the second resin layer 19. That is, the laminate 21 may include three resin layers. Moreover, formation of the above wiring patterns and the resin layers can be repeated to provide the laminate 21 having a laminate of a plurality of wiring patterns and resin layers.

Examples

The present invention will be further described in detail by means of the examples below. However, the present invention is not limited to those examples.

(Wiring substrate)

Figure 9A:
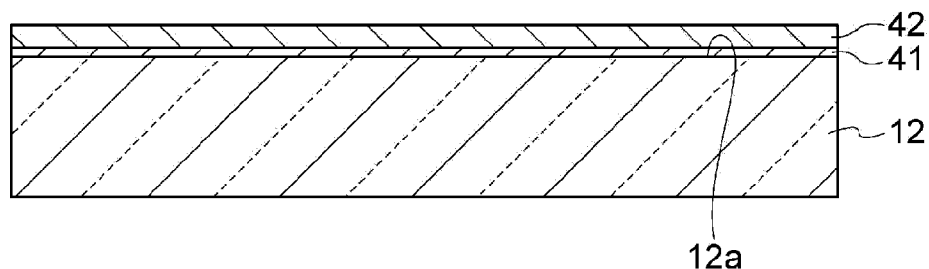
FIGS. 9A to 9C are views which illustrate a method for manufacturing the wiring substrate according to an example.

In the example, as shown in FIG. 9A, the peeling layer 41 and the protective layer 42 were formed in sequence on the main surface 12a of the support body 12. A glass (OA-10G, manufactured by Nippon Electric Glass Co. Ltd, 1.1 mm thick) was used for the support body 12. The support body 12 had a linear expansion coefficient of approximately 4 ppm/° C. The peeling layer 41 on the main surface 12a of the support body 12 was formed by using 3M light-to-heat-conversion (LTHC) release coating (manufactured by 3M Japan Ltd). The protective layer 42 was formed by using 3M UV-curable adhesive LC-5200 (manufactured by 3M Japan Ltd). The peeling layer 41 and the protective layer 42 were formed by spin coating method.

Figure 9B:
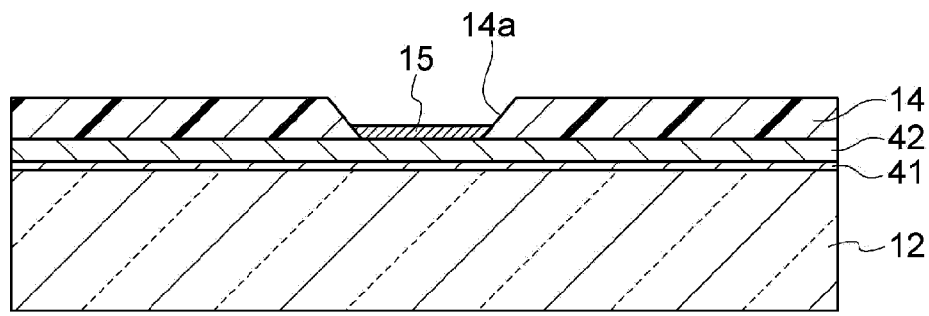
Figure 9C:
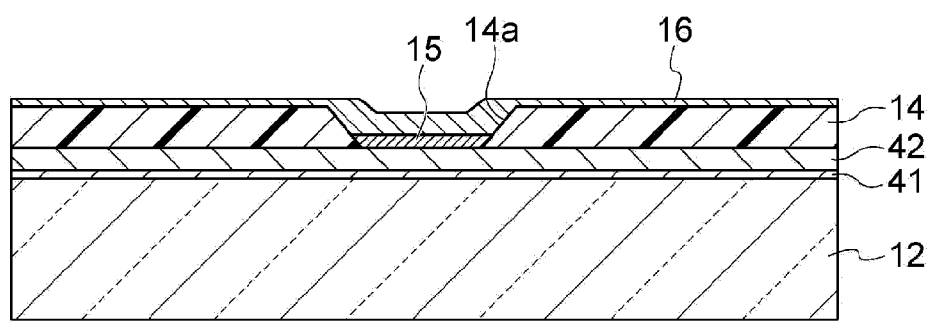

Then, as shown in FIG. 9B, the first resin layer 14 was provided on the protective layer 42, and then the opening 14a was formed in the first resin layer 14. The first resin layer 14 was formed on the protective layer 42 by a vacuum laminating method. ABF-GX-T31 (manufactured by Ajinomoto Fine-Techno Co., Inc.) was used for the first resin layer 14. The opening 14a was formed by laser irradiation. The connection pad 15 is formed in the opening 14a by Au plating.

Then, as shown in FIGS. 9C to FIG. 10B, the wiring pattern 18 was formed by a semi-additive method after the connection pad 15 was formed. The wiring pattern 18 was made of Cu. Further, the second resin layer 19 was formed after the wiring pattern 18 was formed, thereby forming the opening 19a in the second resin layer 19. The second resin layer 19 was formed on the first resin layer 14 and the wiring pattern 18 by a vacuum laminating method. ABF-GX-T31 (manufactured by Ajinomoto Fine-Techno Co., Inc.) was used for the second resin layer 19. The opening 19a was formed by laser irradiation.

Figure 10A:
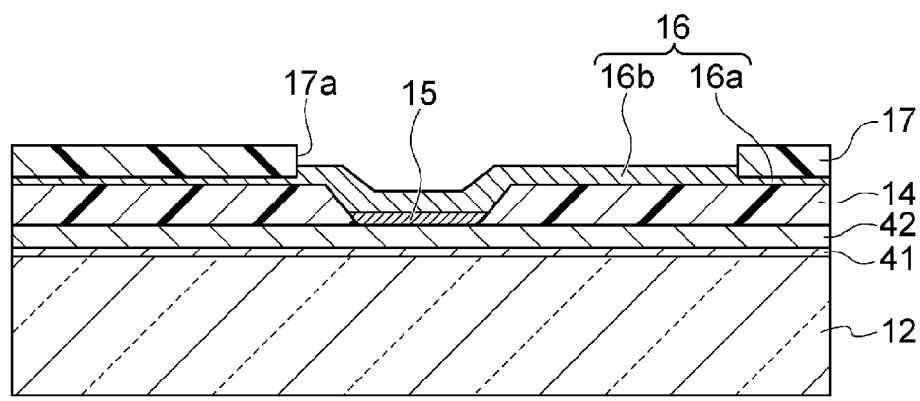
FIGS. 10A to 10C are views which illustrate a method for manufacturing the wiring substrate according to an example.
Figure 10B:
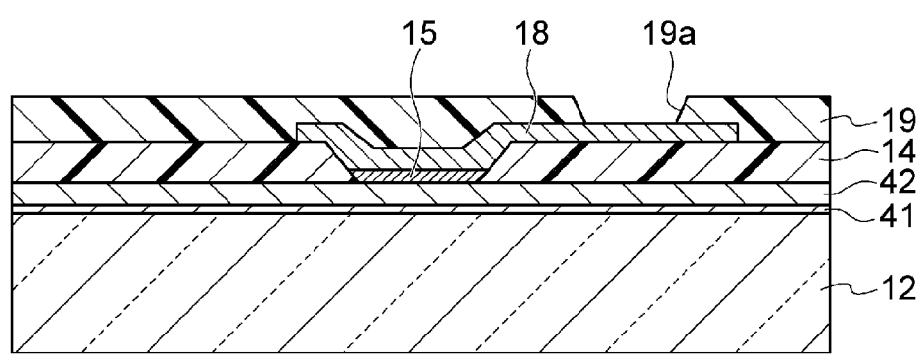
Figure 10C:
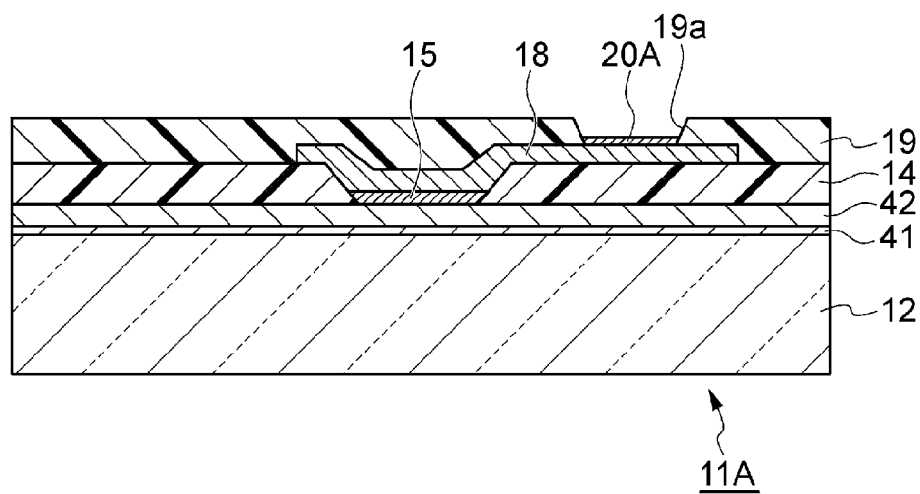

Finally, as shown in FIG. 10C, the wiring substrate 11A which included the laminate 21 was obtained by forming the connection terminal 20A by applying OSP treatment in the opening 19a. The laminate 21 made up of the first resin layer 14, the second resin layer 19 and the wiring pattern 18 had a thickness of approximately 0.07 mm.

(Semiconductor Device)

Next, the semiconductor chip 22 was mounted on the obtained wiring substrate 11A. The semiconductor chip 22 had the bump electrode 23 in which Sn-3.5 Ag solder layer was formed on the tip of Cu post. The semiconductor chip 22 had a linear expansion coefficient of approximately 3 ppm/° C. The underfill 24 was supplied to the wiring substrate 11A in advance. After the bump electrodes 23 of the semiconductor chip 22 were aligned with the connection terminals 20 of the wiring substrate 11A, the semiconductor chip 22 was crimped to the wiring substrate 11A and heated. After that, the top surface of the wiring substrate 11A including the semiconductor chip 22 was sealed by a transfer mold method by using the mold resin 25. Then, a YAG laser at 1064 nm was irradiated onto the support body 12 of the wiring substrate 11A in a linearly reciprocating manner on the entire surface of the support body to thereby remove the support body 12 from the wiring substrate 11A. Further, after an adhesive tape was adhered to the laminate 21 and the protective layer 42, the adhesive tape was peeled to remove the protective layer 42 from the wiring substrate 11A. Then, Sn-3Ag-0.5Cu solder ball was mounted on the laminate 21 to form the external connection terminal 31. The structure was adhered to the dicing tape and diced to thereby obtain the semiconductor device 1 shown in FIG. 1.

(Observation by using a Fluoroscopic Apparatus)

For the semiconductor device 1 manufactured as described above, observation was performed by using a fluoroscopic apparatus (manufactured by Uni-hite system Co. Ltd., XVA-160α). From the observation result of the semiconductor device 1, there was displacement of approximately 2 μm from the design value between the bump electrode 23 of the semiconductor chip 22 and the connection terminal 20 of the wiring substrate 11A. When the support body made of polyimide having a relatively low linear expansion coefficient in resins is used for the support body for the wiring substrate which is used for manufacturing of the semiconductor device, displacement of approximately 15 μm from the design value occurs between the bump electrode of the semiconductor chip and the connection terminal of the wiring substrate. This difference in positional displacement depending on the material of the support body seems to be due to a significant difference between the linear expansion coefficient of the support body made of polyimide which is approximately 12 to 50 ppm/° C. and the linear expansion coefficient of the semiconductor chip (approximately 2 to 4 ppm/° C.). Accordingly, it was confirmed that the displacement which occurs between the semiconductor chip and the wiring substrate can be reduced when the support body made of a glass is used for the wiring substrate compared with the case where the support body made of a resin is used.

INDUSTRIAL APPLICABILITY

According to the wiring substrate, the semiconductor device and the method for manufacturing the semiconductor device of the present invention, manufacturing efficiency of the semiconductor device can be improved and the semiconductor device can be reduced in profile, or profile reduction and manufacturing efficiency of the semiconductor device can be improved.

REFERENCE SIGNS LIST

1 . . . semiconductor device
11, 11A . . . wiring substrate
12 . . . support body
13, 13A . . . adhesive layer
14 . . . first resin layer
15 . . . connection pad
16 . . . seed layer
17 . . . resist
18 . . . wiring pattern
19 . . . second resin layer
20, 20A . . . connection terminal
21 . . . laminate
22 . . . semiconductor chip
23 . . . bump electrode
24 . . . underfill
25 . . . mold resin
31 . . . external connection terminal
33 . . . dicing tape
41 . . . peeling layer
42 . . . protective layer
L . . . laser beam

What is claimed is:

1. A wiring substrate comprising:
a support body having transparency;
an adhesive layer disposed on a main surface of the support body; and
a laminate disposed on the adhesive layer, the laminate including a first resin layer, a second resin layer disposed on the first resin layer, and a wiring pattern disposed at least between the first resin layer and the second resin layer, wherein
the adhesive layer includes a peeling layer which is disposed on the main surface of the support body and contains a third resin which is decomposed by light irradiation, and a protective layer which is disposed on the peeling layer so as to protect the laminate from the light and contains a fourth resin.

2. The wiring substrate of claim 1, wherein the support body has a linear expansion coefficient in a range of −1 ppm/° C. or more and 10 ppm/° C. or less.

3. The wiring substrate of claim 1, wherein the support body is a glass substrate.

4. The wiring substrate of claim 1, wherein the main surface of the support body has a maximum roughness in a range of 0.01 μm or more and 5 μm or less.

5. The wiring substrate of claim 1, wherein the protective layer is a layer made of the fourth resin or a layer mainly composed of the fourth resin.

6. The wiring substrate of claim 1, wherein the laminate has a thickness in a range of 0.001 mm or more and 1 mm or less.

7. A semiconductor device comprising:
the laminate in the wiring substrate according to claim 1 with the support body removed; and
a semiconductor chip having a bump electrode on a surface of the semiconductor chip such that the semiconductor chip is connected to the wiring pattern of the laminate via the bump electrode.

8. The semiconductor device of claim 7, wherein the wiring pattern and the semiconductor chip are connected to each other via a connection terminal including a solder.

9. The semiconductor device of claim 7, wherein the wiring pattern and the semiconductor chip are connected to each other via connection terminal including gold.

10. A method for manufacturing a semiconductor device, the method comprising the steps of:
providing the wiring substrate of claim 1;
mounting the semiconductor chip on the laminate of the wiring substrate and bonding the semiconductor chip to the wiring pattern; and
peeling the support body from the laminate by irradiating light onto the adhesive layer via the support body.

11. The method for manufacturing a semiconductor device of claim 10, wherein the light is a laser beam.

12. The method for manufacturing a semiconductor device of claim 10, further comprising the step of:
covering the semiconductor chip bonded to the wiring pattern with a sealing resin.

13. The method for manufacturing a semiconductor device of claim 10, further comprising the step of:
removing the adhesive layer from the laminate after the step of peeling the support body from the laminate.

14. The method for manufacturing a semiconductor device of claim 10, further comprising the steps of:
providing an external connection terminal on the laminate after the step of peeling the support body from the laminate; and
cutting the laminate for singulation.

* * * * *